(12) United States Patent
Nagata

(10) Patent No.: US 7,019,982 B2
(45) Date of Patent: Mar. 28, 2006

(54) FOOLPROOF POLARITY INDICATIONS OF POLED ELECTRONIC PARTS OR DEVICES IN PRINTED CIRCUIT BOARD

(75) Inventor: Kazuyuki Nagata, Fukui (JP)

(73) Assignee: Orion Electric Co., Ltd., Fukui (JP)

( * ) Notice: Subject to any disclaimer, the term of this patent is extended or adjusted under 35 U.S.C. 154(b) by 314 days.

(21) Appl. No.: 10/452,455

(22) Filed: Jun. 3, 2003

(65) Prior Publication Data
US 2004/0001327 A1  Jan. 1, 2004

(30) Foreign Application Priority Data
Jun. 26, 2002  (JP)  ............... 2002-186209

(51) Int. Cl.
H05K 1/00  (2006.01)
H05K 1/18  (2006.01)
H05K 7/02  (2006.01)
H05K 7/06  (2006.01)
H05K 7/08  (2006.01)

(52) U.S. Cl. ............. 361/748; 361/807; 361/808; 361/809; 361/810

(58) Field of Classification Search ........... 361/748, 361/760, 772, 773, 774, 782; 174/250, 260
See application file for complete search history.

(56) References Cited

U.S. PATENT DOCUMENTS

| | | | | |
|---|---|---|---|---|
| 3,755,626 | A | * | 8/1973 | Lace .................. 381/101 |
| 4,376,538 | A | * | 3/1983 | Keenan ................ 273/275 |
| 5,742,486 | A | * | 4/1998 | Yangkuai .............. 361/807 |
| 6,272,018 | B1 | * | 8/2001 | Feld et al. ............. 361/760 |
| 6,876,572 | B1 | * | 4/2005 | Turner ................. 365/156 |

FOREIGN PATENT DOCUMENTS

JP  5-20392  3/1993
JP  2000-151042  5/2000

\* cited by examiner

*Primary Examiner*—Kamand Cuneo
*Assistant Examiner*—Ivan Carpio
(74) *Attorney, Agent, or Firm*—Wenderoth, Lind & Ponack, L.L.P.

(57) ABSTRACT

A foolproof polarity indication for poled electronics parts or devices to be mounted to a printed circuit board assures that the poled electronics parts and/or devices are correctly mounted with respect of their polarities to meet occasional requirements dependent on different specifications. Each pair of terminal holes is allotted to a given poled electronics part or device. Two symbols representative of such electronics part or device are arranged side by side on either side of a line drawn from one terminal hole to the other terminal hole. The poled electronics part or device symbols are of reversed polarities. This dual symbol arrangement is effective to draw a worker's attention in the mounting of electrode components in terms of their polarities. When extra components or dummy components are combined with such a poled component, they are encircled by a boundary line, thereby showing the correct polarity direction of the poled component with respect to whether it is enclosed or not.

6 Claims, 3 Drawing Sheets

US 7,019,982 B2

FOOLPROOF POLARITY INDICATIONS OF POLED ELECTRONIC PARTS OR DEVICES IN PRINTED CIRCUIT BOARD

BACKGROUND OF THE INVENTION

1. Field of the Invention

The present invention relates to a foolproof polarity indicator for poled electronics parts or devices to be mounted to a printed circuit board to assure that the poled electronics parts and/or devices are correctly mounted in respect of their polarities to meet occasional requirements dependent on different specifications.

2. Related Art

Almost all electronics parts or devices are mounted on printed circuit boards by using an automatic machine such as a chip mounter, but extra parts or devices or relatively large or odd-shaped parts or devices are handled and mounted onto printed circuit boards by hand. As is well known, some extra parts or devices are required to be oriented and mounted correctly in terms of their polarities.

To assure that such poled parts or devices are always mounted on printed circuit boards correctly in terms of their polarities, it is necessary that polarity indications are given to printed circuit boards. Thus, before permanently fixing poled parts or devices onto printed circuit boards, workers can confirm that the poled parts or devices are correctly oriented on the printed circuit boards. Such polarity indications, however, are too small and hardly visible to the eyes, and therefore, there is still a fear for wrongly mounting such poled parts and devices in respect their polarities. As for the "printed wiring board" proposed in JP 2000-151042(A) prior-mount-visible polarity indication marks are different from post-mount-visible polarity indication marks in size. Specifically, prior-mount-visible marks to help workers correctly orient and fix poled parts or devices are the same in size and shape as poled parts or devices to be mounted (see FIG. 3a).

JP 5-20392(U) discloses a "printed circuit board" on which adhesive labels are attached that describe the specification of the printed circuit board. This facilitates discrimination of similar printed circuit boards in terms of different specifications, permitting common use of the same kinds of printed circuit boards without fear of mounting wrong parts and/or devices.

In the case that similar printed circuit boards are used to provide different products to meet different specifications, it may be required that poled parts or devices be mounted with their polarities actually reversed to what are shown in the indications. In such a case, electrolytic condensers of non-polarity type are used, and printed circuit boards used are also of non-polarity (see FIG. 3b). This remedy, however, has high costs.

As another example of a remedy, two reversed symbol marks are applied symmetrically as shown in FIG. 3(c), indicating that a poled part or device can be reversed in polarity when mounted there. This indication, however, cannot tell which direction is correct with regard to a poled part or device to be mounted there. Also, disadvantageously, extra space available to such dual indication is required around a place at which the poled part or device is mounted. Sometimes, it is required that use is made of an enlarged printed circuit board, which is large enough to provide space available for such dual indications.

One object of the present invention is to provide a printed circuit board bearing foolproof polarity indications to assure that poled parts and/or devices be correctly mounted to meet occasional requests.

SUMMARY OF THE INVENTION

To attain this object a foolproof polarity indication to be given to a printed circuit board pertaining to poled electronics parts or devices, such as electrolytic condensers or diodes, to assure that such poled components be correctly mounted in respect of their polarities to meet occasional requirements dependent on different specifications, is improved according to the present invention as follows:

1) each pair of terminal holes allotted to a given poled electronics part or device has two symbols representative of such poled components arranged side by side on either side of a line drawn from one terminal hole to the other terminal hole, such two symbols being of reversed polarities;
2) in the case that one of the indicated paired, poled electronics parts or devices is used in association with extra electronics parts and/or devices, the correct poled part or device indication and associated parts and devices' indications are encircled by a boundary line, so that the correct poled part or device may be assured to be mounted in association with the extra parts and/or devices; or
3) in the case that there are no extra electronics parts and/or devices, the correct poled part or device indication and dummy parts and devices in place of such extra parts and devices are encircled by a boundary line, so that the correct poled part or device may be assured to be mounted in association with such dummy parts and/or devices.

Other objects and advantages of the present invention will be understood from the following description of foolproof polarity indications of poled electronics parts or devices according to preferred embodiments of the present invention, which are shown in the accompanying drawings.

DETAILED DESCRIPTION OF PREFERRED EMBODIMENT

Figure 1A:
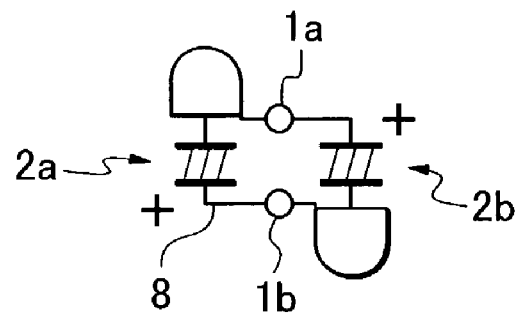
FIGS. 1(a) and 1(b) are two examples of foolproof polarity indications according to the present invention.

FIG. 1(a) shows a foolproof polarity indication of a poled device to be mounted, that is, an electrolytic condenser. A pair of through holes 1a and 1b is made on a printed circuit board to be allotted to the electrolytic condenser. These through holes 1a and 1b appear on a printed circuit pattern on the rear side of the printed circuit board. The two lead wires of the electrolytic condenser pass through these terminal holes 1a and 1b to be bent and soldered to the printed circuit pattern on the rear side of the printed circuit board.

As seen from the drawing, two symbols 2a and 2b representative of the electrolytic condenser are arranged side by side on either side of a line drawn from one terminal hole to the other terminal hole. The plus (+) sign is given on the upper or lower side of the condenser symbol. This indicates that the condenser can be mounted with its polarity reversed to meet the specification, effectively drawing a worker's attention. The reversed condenser indications 2a and 2b are connected by joint lines 8, on which the terminal holes 1a and 1b exist.

Figure 1B:
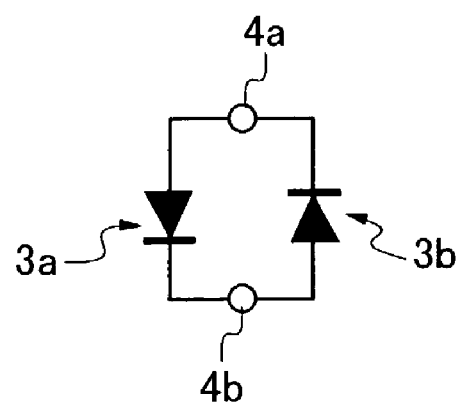

FIG. 1(b) shows another foolproof polarity indication of a poled device, that is, a diode. A pair of through holes 4a and 4b is made on a printed circuit board to be allotted to the diode to be mounted. These through holes 4a and 4b appear on a printed circuit pattern on the rear side of the printed circuit board. The two lead wires of the diode to be mounted pass through these terminal holes 4a and 4b to be bent and soldered to the printed circuit pattern on the rear side of the printed circuit board.

As seen from the drawing, two symbols 3a and 3b representative of the diode are arranged with their polarities reversed. This indicates that the diode can be mounted with its polarity reversed to meet the specification, thus drawing a worker's attention.

Figure 2A:
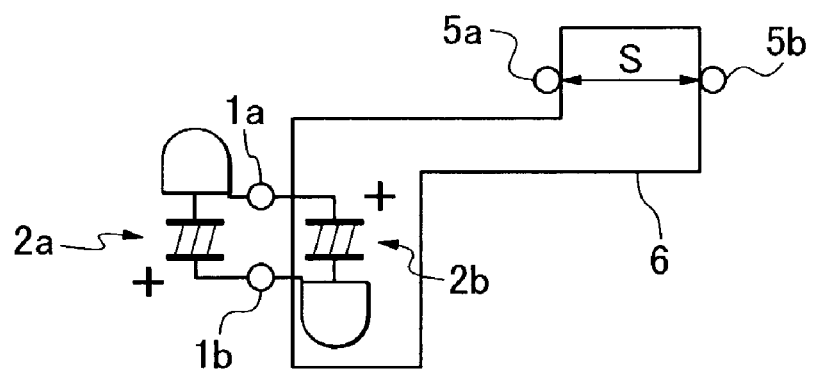
FIGS. 2(a) and 2(b) are another two examples of foolproof polarity indications according to the present invention.
Figure 2B:
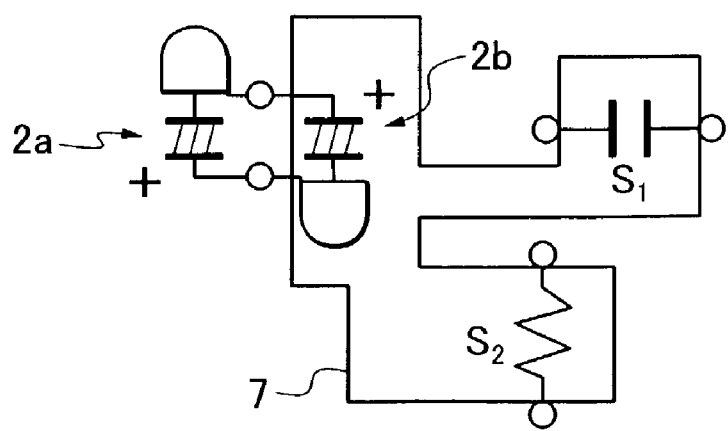
Figure 3A:
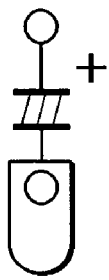
FIGS. 3(a)–3(c) are some examples of conventional polarity indications.
Figure 3B:
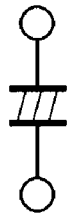
Figure 3C:
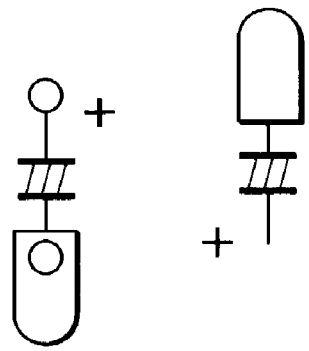

FIGS. 2(a) and 2(b) show other examples of foolproof polarity indication of a poled device, that is, an electrolytic capacitor. In the case that one of the indicated, paired, poled components 2a and 2b is actually associated with extra components S; S1 and S2, the correct poled component 2b and associated components S; S1 and S2 are encircled by a boundary line 6 or 7, so that the correct poled component 2b may be assured to be mounted in association with the extra components S; S1 and S2.

Specifically, a pair of through terminal holes 1a and 1b is made on a printed circuit board to be allotted to the electrolytic condenser. Two symbols 2a and 2b representative of the electrolytic condenser are arranged side by side on either side of the line drawn from one terminal hole to the other terminal hole. The plus (+) sign is given on upper or lower side of each condenser symbol. Another pair of terminal holes 5a and 5b is made for mounting another electronics component S.

As seen from the drawing, the correct-oriented condenser indication 2b and an associated component indication S are encircled by a boundary line 6, assuring that the correct-oriented condenser be mounted in association with the extra component S.

FIG. 2(b) shows a similar circuit configuration in which one electrolytic condenser symbol 2b, one condenser symbol S1 and one resistor symbol S2 are encircled by a boundary line 7. When mounting these parts and devices, workers will be careful in mounting the electrolytic condenser 2b so that it may be mounted with its polarity correctly oriented as indicated by the encircled electrolytic capacitor indication 2b. In case that there are no extra parts or devices S1 and S2, the electrolytic capacitor is mounted according to the indication of the unenclosed electrolytic capacitor 2a.

In the case that dummy components are mounted in place of such actual extra electronics components, the correct poled component indication and dummy indications are encircled by a boundary line, so that the correct poled component may be assured to be mounted in association with such dummy components.

What is claimed is:

1. A printed circuit board for ensuring that a poled electronics part or device is correctly mounted thereon, with respect to a polarity of the poled electronics part or device, to meet requirements of differing specifications, the printed circuit board comprising:
    a pair of terminal holes allotted to a poled electronics part or device; and
    a pair of symbols for the pair of terminal holes, each of the pair of symbols representing the poled electronics part or device to which the pair of terminal holes is allotted, the pair of symbols being marked on the printed circuit board so as to be poled electronics parts or devices to be arranged side by side on either side of a line connecting one of the terminal holes to another of the terminal holes, the pair of symbols being of reversed polarity with respect to each other.

2. A printed circuit board for ensuring that a poled electronics part or device is correctly mounted thereon, with respect to a polarity of the poled electronics part or device, to meet requirements of differing specifications, the printed circuit board comprising:
    a pair of terminal holes allotted to a poled electronics part or device;
    a pair of symbols for the pair of terminal holes, each of the pair of symbols representing the poled electronics part or device to which the pair of terminal holes is allotted, the pair of symbols being marked on the printed circuit board so as to be arranged side by side on either side of a line connecting one of the terminal holes to another of the terminal holes, the pair of symbols being of reversed polarity with respect to each other; and
    at least one additional symbol marked on the printed circuit board, the at least one additional symbol being representative of an additional part or device to be mounted with a predetermined orientation of a polarity of the poled electronics part or device,
    wherein one of the pair of symbols with the predetermined orientation of the polarity of the poled electronics part or device and the at least one additional symbol are encircled by a boundary line.

3. A printed circuit board for ensuring that a poled electronics part or device is correctly mounted thereon, with respect to a polarity of the poled electronics part or device, to meet requirements of differing specifications, the printed circuit board comprising:
    a pair of terminal holes allotted to a poled electronics part or device;
    a pair of symbols for the pair of terminal holes, each of the pair of symbols representing the poled electronics part or device to which the pair of terminal holes is allotted, the pair of symbols being marked on the printed circuit board so as to be arranged side by side on either side of a line connecting one of the terminal holes to another of the terminal holes, the pair of symbols being of reversed polarity with respect to each other; and
    at least one additional symbol marked on the printed circuit board, the at least one additional symbol being representative of a dummy component to be mounted in association with the poled electronics part or device with a predetermined orientation of a polarity of the poled electronics part or device, wherein one of the pair of symbols with the predetermined orientation of the polarity of the poled electronics part or device and the at least one additional symbol are encircled by a boundary line.

4. A printed circuit board according to claim 1, wherein the pair of symbols is connected by lines passing through the pair of terminal holes.

5. A printed circuit board according to claim 2, wherein the pair of symbols is connected by lines passing through the pair of terminal holes.

6. A printed circuit board according to claim 3, wherein the pair of symbols is connected by lines passing through the pair of terminal holes.

* * * * *